United States Patent [19]

Richards

[11] Patent Number: 4,584,045
[45] Date of Patent: Apr. 22, 1986

[54] APPARATUS FOR CONVEYING A SEMICONDUCTOR WAFER

[75] Inventor: Edmond A. Richards, Marlton, N.J.

[73] Assignee: Plasma-Therm, Inc., Kresson, N.J.

[21] Appl. No.: 581,856

[22] Filed: Feb. 21, 1984

[51] Int. Cl.[4] .................. H01L 21/306; B44C 1/22; C03C 15/00; C03C 25/06
[52] U.S. Cl. ................................. 156/345; 156/643; 156/646; 204/298; 414/222; 414/744 R
[58] Field of Search ................... 156/345, 643, 646; 204/192 E, 192 EC, 298; 414/222, 225, 226, 744 R

[56] References Cited

U.S. PATENT DOCUMENTS

| | | | |
|---|---|---|---|
| 3,968,885 | 7/1976 | Hassan et al. | 214/1 |
| 4,094,722 | 6/1978 | Yamamoto et al. | 156/345 |
| 4,149,923 | 4/1979 | Uehara et al. | 156/345 |
| 4,252,595 | 2/1981 | Yamamoto et al. | 156/345 |
| 4,282,924 | 8/1981 | Faretra | 165/80 |
| 4,318,767 | 3/1982 | Hijikata et al. | 156/345 |
| 4,341,582 | 7/1982 | Kohman et al. | 156/345 |
| 4,388,034 | 6/1983 | Takahashi | 414/331 |
| 4,392,915 | 7/1983 | Zajac | 156/643 |
| 4,483,654 | 11/1984 | Koch et al. | 414/744 R |

Primary Examiner—William A. Powell
Attorney, Agent, or Firm—Panitch Schwarze Jacobs & Nadel

[57] ABSTRACT

A transfer apparatus for conveying a semiconductor wafer between a first location and a second location comprises transfer arm means including first and second elongated arm members each having first and second ends. The first end of the first arm member is pivotally supported at a point generally midway between the two locations and the first end of the second arm member is pivotally supported by the first arm member proximate to the second end thereof. The first and second arm members are of sufficient length and are cooperative to pivot to at least a first position in which at least a part of the second arm extends to the first location, a second position in which at least a part of the second arm member extends to the second location and an intermediate position. Arm member actuator means are provided for pivoting the first and second arm members to the first, second and intermediate positions.

15 Claims, 6 Drawing Figures

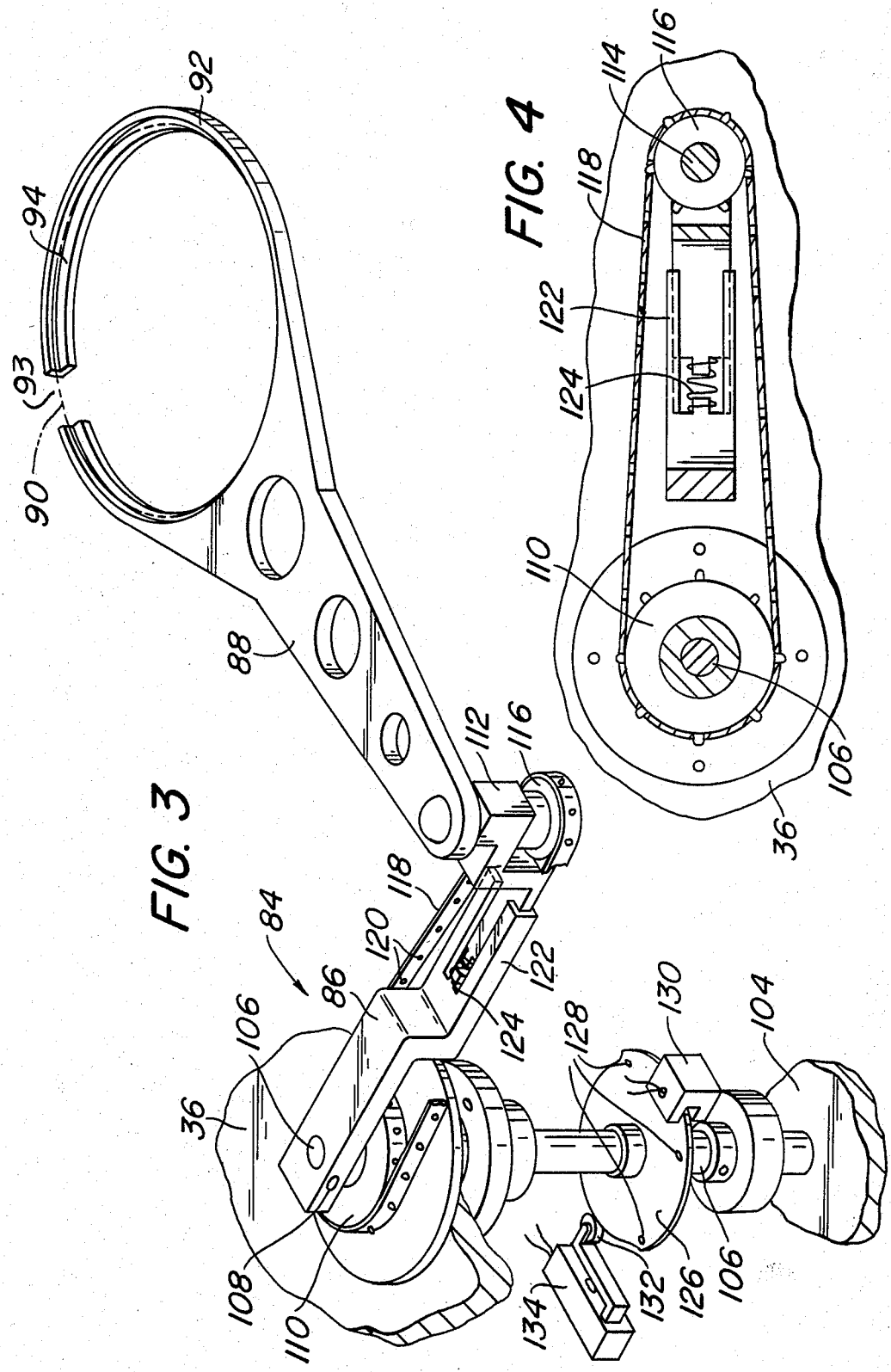

APPARATUS FOR CONVEYING A SEMICONDUCTOR WAFER

BACKGROUND OF THE INVENTION

The present invention relates to a transfer apparatus for conveying a semiconductor wafer between two locations and, more particularly, to such a transfer apparatus which can conveniently transfer such a semiconductor wafer between two locations having differing pressures without substantially affecting or disturbing the pressure at either of the two locations.

The etching of semiconductor wafer materials utilizing a gas plasma reaction in an evacuated or vacuum chamber is generally well-known in the art. The apparatus for the treatment of semiconductor wafers by such a gas plasma reaction can be classified into two major types: (1) batch, in which a plurality of sheets of wafers are placed inside of a reaction or treatment chamber for simultaneous treatment; and (2) continuous, in which the semiconductor wafers are continuously serially introduced into the reaction or treatment chamber one at a time and are individually removed from the treatment chamber after the gas plasma treatment.

Numerous prior art devices and methods have been employed for transferring the semiconductor wafers into or out of a reaction chamber for continuous treatment without disturbing or otherwise affecting the vacuum or pressure level within the reaction chamber. Most of the prior art devices employ a separate feeding or inlet chamber (air lock) adjacent the reaction or treatment chamber. A mechanical device is employed for transferring the wafers into the feeding or inlet chamber one at a time and, once the pressure within the feeding or inlet chamber has been adjusted to correspond to the pressure within the reaction chamber for transferring the wafers into the reaction chamber. In some of the prior art transfer devices, one or more conveyor belts are employed for the actual movement of the semiconductor wafer into and out of the feeding chamber. Other such devices employ piston actuated pusher members for moving the semiconductor wafers. Yet other prior art devices employ a complicated walking beam arrangement for moving the semi-conductor wafers.

While the prior art devices for moving a semi-conductor wafer into or out of a reaction chamber generally function satisfactorily, they are usually mechanically complex and, therefore, are expensive to purchase and operate and may require frequent service. In addition, because of the way in which the prior art devices operate, it is difficult if not impossible to ascertain the exact location of a particular wafer being transferred at any given time during the transfer cycle. As a result, sometimes wafers are damaged or destroyed by the opening or closing of a reaction chamber or feeding chamber door when a wafer is in the wrong position. This causes not only a loss of the wafer, but also possible contamination of the apparatus which must then be cleaned before any wafer processing can be resumed.

In addition to the previously described drawbacks, the prior art transfer devices do not lend themselves to the conducting of any pre-treatment or post-treatment processing of a wafer within the entry or exit chamber while it is being transferred. Pre-treatment processing such as hardening the photo resist material or desmearing the wafer to remove any accumulated oxide can be helpful in speeding up the etching process which occurs within the plasma treatment chamber and/or providing a better quality product. Post-treatment processes such as stripping the photo resist material off of the wafer can also be useful in speeding up the wafer production process.

The present invention provides a compact, mechanically simple wafer transfer apparatus which is inexpensive to produce and operate and yet provides a reliable, positive wafer transfer motion which permits the location of the wafer to be determined during the transfer process. The present invention also permits pre-treatment and post-treatment processing of the semiconductor wafer in conjunction with the wafer transfer process.

SUMMARY OF THE INVENTION

Briefly stated, the present invention comprises transfer apparatus for conveying a semiconductor wafer between a first location at a first pressure and a second location at a second pressure without substantially affecting the pressure at either location comprising:

a substantially airtight transfer chamber disposed between the first and second locations, the transfer chamber including a first closeable port for providing communication between the first location and the transfer chamber, a second closeable port for providing communication between the second location and the transfer chamber and port actuator means for opening and closing the first and second ports;

transfer means for transferring the wafer between locations including first and second elongated arm members each having first and second ends, the first end of the first arm member being pivotally supported within the transfer chamber and the first end of the second arm member being pivotally supported by the first arm member proximate to the second end of the first arm member, the second end of the second arm member being adapted to receive and support a semiconductor wafer, the first and second arm members being of sufficient length and being cooperative to pivot to at least three positions, the three positions including a first position in which at least a portion of the second end of the second arm member extends through the first port, a second position in which at least a portion of the second end of the second arm member extends through the second port, and an intermediate position in which both arm members are located within the transfer chamber, whereby a semiconductor wafer may be placed upon the second end of the second arm member when the arm members are in one of the first or second positions and may be removed when the arm members are in the other of the first and second positions;

arm member actuator means for pivoting the first and second arm members to the first, second and intermediate positions;

pressure adjusting means for adjusting the pressure within the transfer chamber to either the first or the second pressure; and control means for controlling the port actuator means, the arm member actuator means and the pressure adjusting means, whereby the pressure within the transfer chamber is adjusted only when both ports are closed with the arm members in the intermediate position, whereby the first port is opened to permit the arm members to pivot to the first position only when the pressure within the transfer chamber has been adjusted to the first pressure, and, whereby the second port is opened to permit the arm members to pivot to the second position only when the pressure within the transfer chamber has been adjusted to the second pressure.

BRIEF DESCRIPTION OF THE DRAWINGS

The foregoing summary, as well as the following detailed description will be better understood when read in conjunction with the appended drawings. For the purpose of illustrating the invention, there is shown in the drawings an embodiment which is presently preferred, it being understood that the invention is not limited to the precise arrangement and instrumentality shown. In the drawings:

FIG. 3 is an enlarged perspective view of the transfer arm members portion of the apparatus of FIG. 1;

FIG. 4 is a sectional view of a portion of the apparatus taken along line 4—4 of FIG. 2;

DESCRIPTION OF A PREFERRED EMBODIMENT

Figure 1:
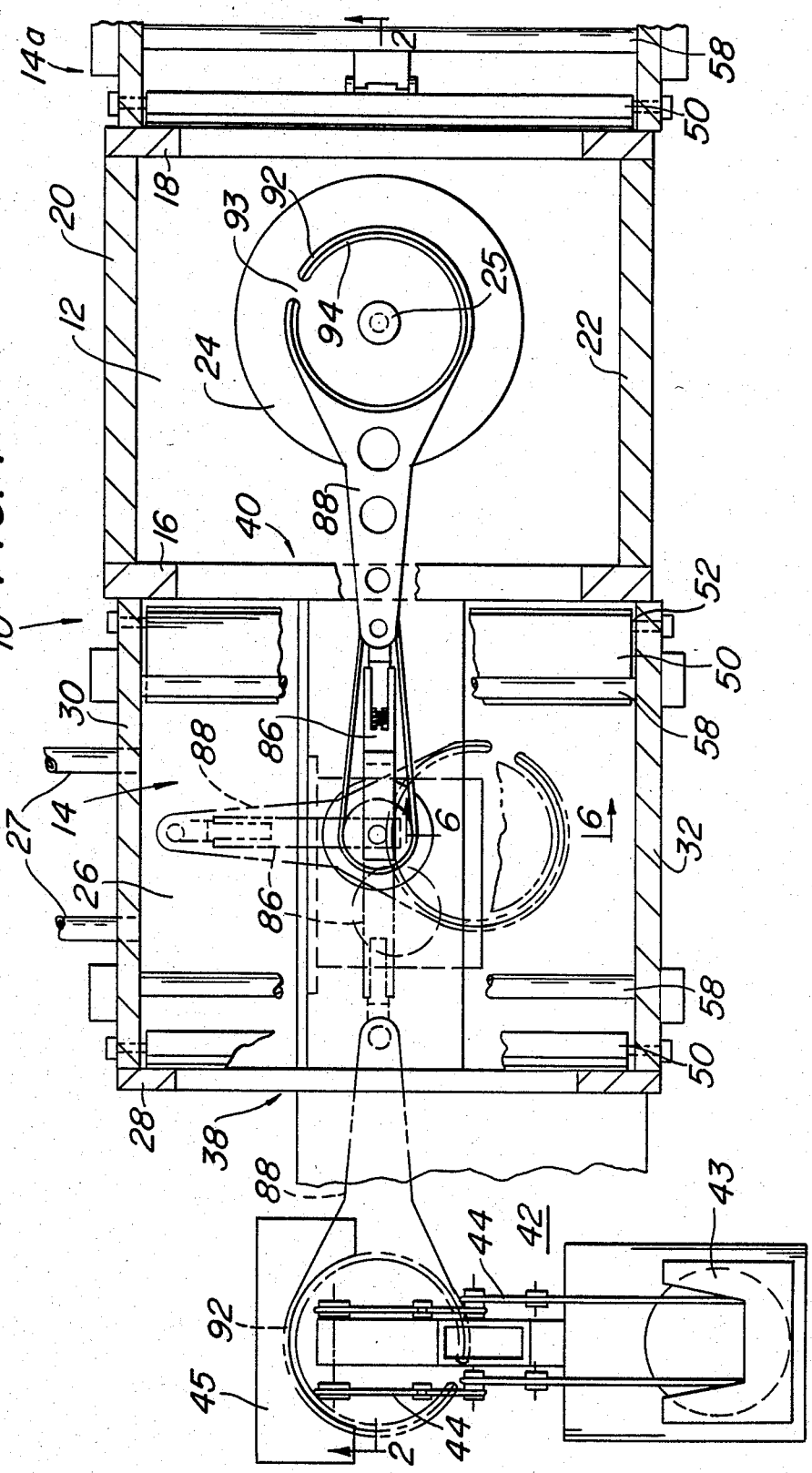
FIG. 1 is a plan view, partially broken away, of a wafer transfer apparatus in accordance with the present invention.

Referring in detail to the drawings, wherein like numerals indicate like elements throughout the several figures, there is shown in FIG. 1 a partially broken away plan view of an apparatus 10 for the continuous or in-line treatment of semiconductor wafers by plasma reaction. The apparatus 10 comprises a main treatment or reaction chamber 12 within which the semiconductor wafers are exposed to the plasma for etching and associated transfer apparatus shown generally as 14, for conveying or transporting the semiconductor wafers to or from the reaction chamber 12.

The reaction chamber 12 of the presently preferred embodiment is typical of plasma reaction chambers presently employed and well known in the art. A detailed description of the structure and operation of the reaction chamber 12 is not believed to be necessary to enable one of ordinary skill in the art to completly understand the present invention and, therefore, will not be presented herein. Such chambers are well known and are commercially available from several manufacturers, including Plasma-Therm, Inc., the assignee of the present invention. For purposes of describing the present invention, suffice it to say that the reaction chamber 12 comprises a generally hollow, sealed chamber having four side walls 16, 18, 20 and 22. The reaction chamber 12 is maintained at a controlled pressure, typically less than atmospheric pressure (i.e. vacuum) by suitable known vacuum pumping means which are not shown in the drawings. A flow of plasma gas from a source (not shown) is introduced into the reaction chamber 12 by suitable conduit means (also not shown) for the treatment or etching of semiconductor wafers. Within the reaction chamber 12 is a generally circular, flat platen 24 which serves to support a semiconductor wafer during the gas plasma treatment and may also serve as an electrode or a ground plane as required.

As discussed above, one of the problems encountered in the continuous or in-line production of semiconductor wafers utilizing such a reaction chamber under a vacuum pressure is that it is difficult to transfer or convey the semiconductor wafers into and out of the reaction chamber without disturbing or otherwise detrimentally affecting the pressure or vacuum within the chamber. It is important to maintain the vacuum within the chamber within a specific predetermined range in order to avoid costly delays in the semiconductor wafer production process and to avoid undesirable variations in the quality of the semiconductor wafer products which are produced. It is therefore necessary to provide a transfer apparatus, such as the transfer apparatus 14 of the present invention which may be employed for conveying the semiconductor wafers into and out of the reaction chamber 12 without significantly affecting or disturbing the vacuum pressure within the chamber.

Figure 2:
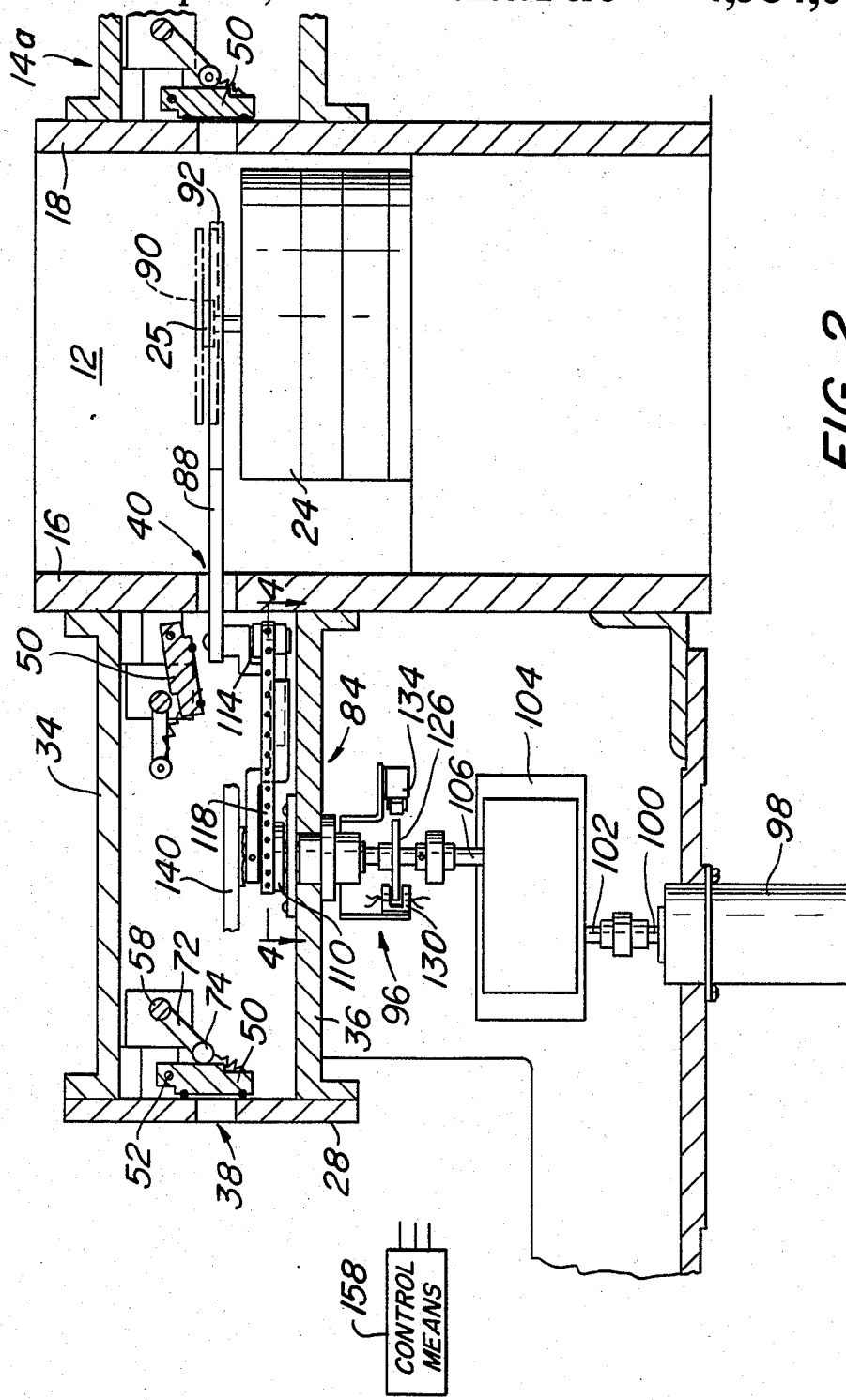
FIG. 2 is a sectional view of the apparatus taken along lines 2—2 of FIG. 1.

For the purpose of maintaining clarity and simplicity in showing and describing the present invention, only a single transfer apparatus 14 will be shown and described. The single transfer apparatus 14 may be employed for transferring the semiconductor wafers both into and out of the reaction chamber 12. Alternatively, in the presently preferred embodiment as shown in the drawings, the transfer apparatus 14 is employed only for the purpose of transferring the semiconductor wafers into the reaction chamber 12 and a second transfer apparatus 14a (only a portion of which is shown in FIGS. 1 and 2) is employed for removing the semiconductor wafers from the reaction chamber once the plasma reaction process has been completed. The structure of the second transfer apparatus 14a is substantially the same as (actually a mirror image of) transfer apparatus 14 and the operation thereof will be apparent to one skilled in the art from the operation of transfer apparatus 14 which will hereinafter be described.

Transfer apparatus 14 comprises a substantially airtight transfer chamber, in the present embodiment a wafer inlet chamber 26, adjoining or disposed adjacent to the reaction chamber 12 as shown. For purposes which will hereinafter become apparent, the transfer chamber 26 shares a common sidewall 16 with the reaction chamber 12 and includes three additional sidewalls 28, 30 and 32, as well as top and bottom walls 34 and 36, respectively. The six walls of the transfer chamber are connected together in any known manner capable of providing sealed joints between the walls to provide a substantially airtight chamber. In the presently preferred embodiment, the transfer chamber 26 is generally square in plan as shown, it being understood that the invention is not limited to a chamber having any particular shape. Means (not illustrated) well known to those skilled in the art, are provided for adjusting the pressure within the transfer chamber 26. The pressure adjusting means communicate with the chamber via conduits 27.

The transfer chamber 26 includes a pair of closeable, sealable transfer ports or slot valves 38 and 40 disposed on opposite lateral sides thereof as shown in FIGS. 1 and 2. The first transfer port 38 serves as an inlet port and extends through transfer chamber sidewall 28 to provide communication between the transfer chamber 26 and a location outside of the transfer chamber 26.

In the presently preferred embodiment as shown in FIG. 1, the outside location comprises a wafer storage area 42 where semiconductor wafers which have been previously prepared for etching (i.e. masked, coated with photo resistant material, etc.) are temporarily stored prior to being introduced into the reaction chamber 12. Typically, such prepared semiconductor wafers are stored in a wafer storage device such as a wafer cassette apparatus 43 which includes means (not shown in detail) for storing a plurality of semiconductor wafers in a vertical stacked relation and an elevator means (not shown) for moving the stack of wafers up or down to permit the removal of the semiconductor wafers one at a time from the top or the bottom of the stack. Conveyor means, such as conveyor belts 44 or the like may be employed for moving the wafers from the storage cassette 43 to the wafer transfer apparatus 14. A wafer stop device 45 may be employed to stop the lateral movement of the wafers along the conveyor belts 44 at the correct position for depositing the wafers onto the wafer transfer apparatus 14. After a wafer is deposited onto the wafer transfer apparatus 14 part or all of the conveyor belts 44 may be pivoted or otherwise moved (not shown) to a position in which they do not interfere with the further movement of the wafer. A more detailed description of the structure and operation of the semiconductor wafer storage device 43 and the conveyor belts 44 is not believed to be necessary for a complete understanding of the present invention and therefore will not be presented herein. Wafer storage and conveyor devices are well known and are commercially available from manufacturers such as Siltec of Menlo Park, Calif.

In the present embodiment as shown in the drawings, the wafer storage area 42 is not maintained under any particular pressure and, therefore, is generally at atmospheric pressure. It should be understood, however, that area 42 could be at some other pressure which may be necessary or convenient for the storage or processing of the semiconductor wafers. It is therefore apparent that the transfer chamber 26 serves as a buffer or transition zone between a location such as the reaction chamber 12, which is usually maintained at a vacuum, and any other location, such as storage area 42, which in the present embodiment is at atmospheric pressure, but may be at any other pressure. In addition, it should be appreciated that although area 42 is shown as being generally open, it could be an enclosed area or chamber. Thus, the transfer apparatus 14 could be employed to transfer the semiconductor wafers between, for example, two chambers of differing and preferably, subatmospheric pressures to isolate one chamber from the other.

The second transfer port 40 extends through reaction chamber sidewall 16 as shown to provide communication between the transfer chamber 26 and the reaction chamber 12. As will hereinafter be described in greater detail, port actuator means identified generally as 46 are provided for opening and closing the first and second transfer ports 38 and 40.

Figure 5:
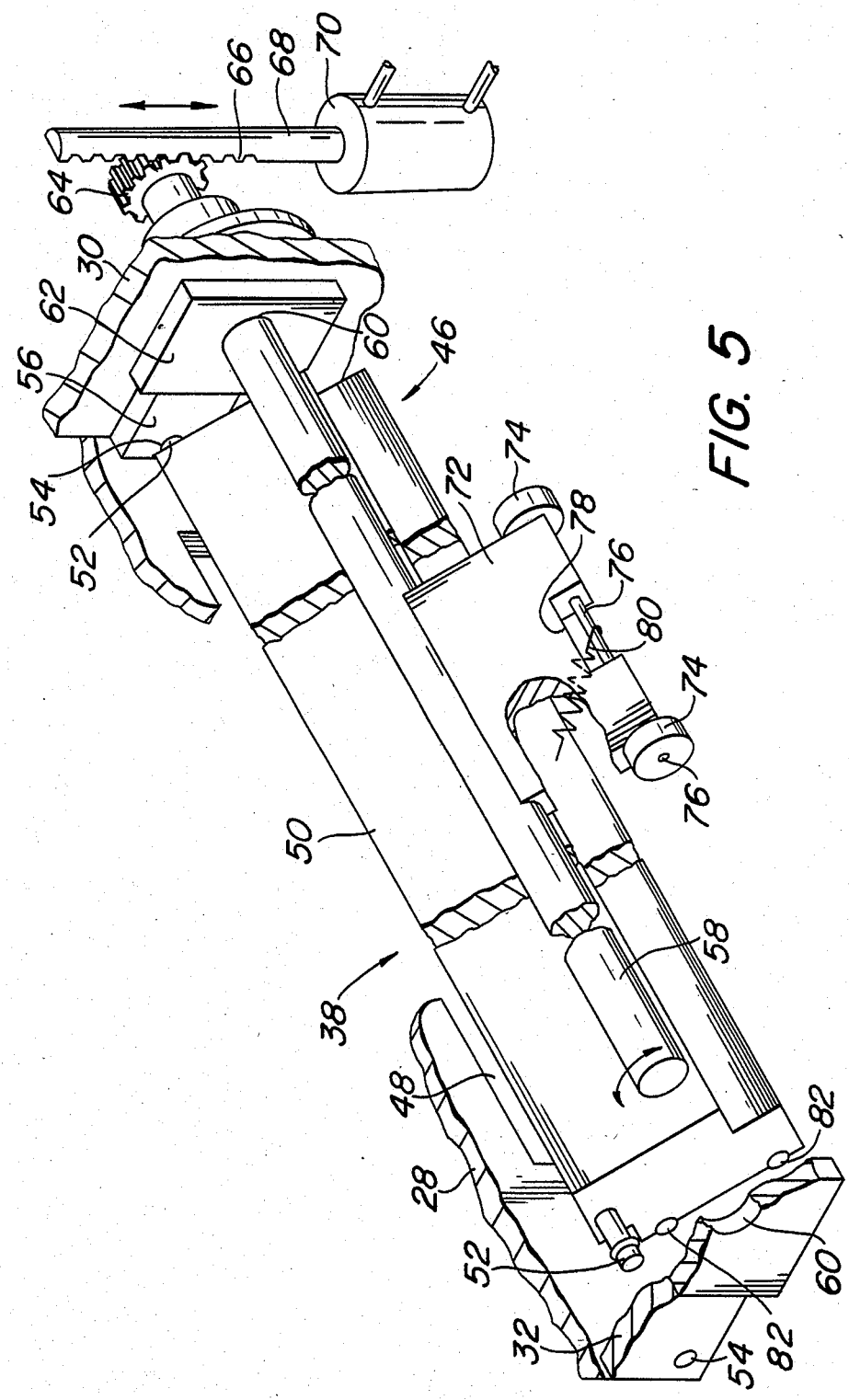
FIG. 5 is an enlarged perspective view of a transfer port portion of the apparatus of FIG. 1.

Referring now to FIG. 5, there is shown in greater detail the first transfer port 38 and the associated transfer port actuator means 46. For purposes of clarity and brevity the structure and operation of only the first transfer port 38 will be presented, it being understood that the structure and operation of the second transfer port 40 is substantially the same. As shown in FIG. 5, port 38 comprises an elongated, generally rectangularly shaped slot or opening 48 extending through a portion of transfer chamber sidewall 28. A corresponding elongated, generally rectangularly shaped door member 50 is located proximate the rectangular opening 48. The door member 50 is slightly larger than the rectangular opening 48 and is shown in the open position in FIG. 5. A generally cylindrical pin member 52 is positioned on each of the upper elongated ends of the door member 50. The pin members 52 extend through suitably sized openings 54 within support blocks 56 which are attached to the transfer chamber sidewalls 30 and 32 for supporting the door member 50. As shown in FIGS. 1, 2 and 5, the pin members 52 cooperate with the support block openings 54 to permit the door member 50 to swing or pivot in a clockwise or counterclockwise direction when viewing FIG. 5, to close or open, respectively, the rectangular opening 48 when actuated in a manner which will hereinafter be described.

The transfer port actuator means 46 associated with port 38 further comprises an elongated actuator shaft 58 positioned proximate to the door member 50 and supported for rotation within suitably sized openings 60 extending through the transfer chamber sidewalls 30 and 32 and through the attached supporting blocks 62. One end of the actuator shaft 58 extends beyond the transfer chamber wall 30 as shown in FIG. 5. A pinion 64 having suitable gear teeth is secured to the outwardly extending portion of the shaft 58. The pinion 64 engages a rack 66 having similarly sized gear teeth which is attached to or formed on at least a portion of the piston rod 68 of cylinder 70. In the present embodiment, the cylinder 70 is an air controlled cylinder of a type which is well-known in the art and which may be purchased commercially from the Rotomation Corp. of Daytona Beach, Fla. Specific details of the structure and operation of the air actuated cylinder 70 are not considered to be necessary for a complete understanding of the present invention and, therefore, will not be set forth herein. Suffice it to say that the introduction of pressurized air into the cylinder 70 causes a piston (not shown) and an attached piston rod 68 to translate in one direction or the other as indicated by the arrows adjacent the piston rod 68. Translational movement of the piston rod 68 causes the rack 66 to drive the pinion 64 which in turn rotates the shaft 58 as shown by the arrows adjacent the shaft 58 in FIG. 5.

Attached to the actuator shaft 58 approximately midway along its length is a radially outwardly extending flange member or lug 72. A pair of roller bearings 74 are supported for rotation upon an axle member 76 extending through suitably sized openings within the distal end of the lug 72. A central portion of the distal end of lug 72 is cut away or removed at 78 to expose a portion of the axle 76 which is attached to tension or biasing means, such as a coil spring 80. The other end of the coil spring 80 is attached to the door member 50 at a point offset from the door member pivot pins 52.

In operation, when it is desired to open the door member 50, air is introduced into the lower end (head side) of the cylinder 72 to move the piston and piston rod 68 upwardly thereby causing the shaft 58 to rotate in a counterclockwise direction as illustrated in FIG. 5. The rotation of the shaft 58 and the corresponding rotational movement of the lug 72 tensions the coil spring 80, thereby causing the lower end of the door member 50 to pivot upwardly about the axis and away from the rectangular opening to the open position as shown in FIGS. 1, 2 and 5. When it is desired to close the rectangular opening 48, pressurized air is introduced into the rod side of the cylinder 72 and the piston and piston rod 68 move downwardly causing the shaft 58 to rotate in a clockwise direction as illustrated in FIG. 5. The clockwise rotation of the shaft 58 causes the bearings 74 on the end of the lug 72 to engage the door member 50 causing the door member to pivot about the pin members 52 to the closed position (shown in FIGS. 1 and 2). Suitable sealing means, for example, neoprene or similar seals 82 are provided on the door member 50. The bearings 74 bear against the door member 50 in a generally perpendicular manner to put a generally normal compression force on the door member 50 to properly compress the seals 82 against the sidewall 28 to provide an airtight pressure seal.

Referring to FIGS. 1, 2 and 3, the transfer apparatus 14 further includes a transfer arm means identified generally as 84 for receiving unprocessed semiconductor wafers from the conveyor belts 44 and for transferring the wafers into the reaction chamber 12. In the presently preferred embodiment the transfer arm means 84 comprises first and second generally horizontally oriented elongated transfer arm members 86 and 88, respectively. A first end of the first transfer arm member 86 is pivotally supported proximate to the center of the transfer chamber 26 in a manner described hereinafter. A first end of the second transfer arm member 88 is pivotally supported proximate to the second end of the first transfer arm member 86. The second end of the second transfer arm member is adapted to receive and support a generally flat semiconductor wafer, shown in phantom in FIG. 3 as 90. As best seen in FIG. 3, the second end of the second arm member 88 generally has the same shape as the semiconductor wafer. For example, where the wafer is circular, the second end of the second arm is in the form of an annular ring member 92 having an inner diameter slightly greater than the outer diameter of the semiconductor wafer 90. The annular ring member 92 has a radially inwardly extending annular flange member or lip 94 having an inner diameter which is slightly less than the outer diameter of the semiconductor wafer so that the lip 94 forms an annular shoulder for supporting the semiconductor wafer as shown. The vertical height of the annular ring member 92 is at least slightly greater than the overall thickness of the semiconductor wafer 90 so the wafer may be retained within the annular ring 92 with little chance of it becoming dislodged due to the horizontal pivotal movement of the second arm member 88. A small arcuate portion of the annular ring member 92 and the annular lip member 94 is cut away or removed to form a slot 93 as shown in FIG. 1. The purpose of the slot 93 is to permit the second arm member 88 to be withdrawn from the reaction chamber 12 after a wafer 90 has been lifted upwardly by a wafer lifting device 25 (best seen in FIG. 2) which is employed to move the wafer onto the supporting platen 24.

Referring now to FIG. 1, it can be seen that the first and second arm members 86 and 88 cooperate to pivot horizontally through approximately 180 degrees to at least three different positions. In the first, lefthand position as shown in phantom, both of the arm members 86 and 88 extend toward the left when viewing FIG. 1, the respective lengths of the arm members being such that at least a portion (approximate ¾ of the length) of the second arm member 88 extends through the first transfer port 38 for receiving a semiconductor wafer from the conveyor belts 44. In the second, righthand position as shown in solid lines in FIG. 1, both of the arm members 86 and 88 extend toward the right when viewing FIG. 1. In the second position, at least a portion (approximately ¾ of the length) of the second arm member 88 extends into the reaction chamber 12 to permit the removal of a semiconductor wafer by the upward movement of the wafer lifting device 25. In the intermediate position which is also shown in phantom in FIG. 1, both of the arm members 86 and 88 are entirely located within the transfer chamber 26 with the second arm member 88 being positioned substantially above and parallel to the first arm member 86 as shown.

As will be apparent from the foregoing description, when the arm members 86 and 86 are in the first position an unprocessed semiconductor wafer 90 may be transferred from the conveyor belt 42 onto the second end of the second arm member 88. Thereafter, the two arm members 86 and 88 may be pivoted 90 degrees to the intermediate position in the transfer chamber 26 and an additional 90 degrees to the second position where the unprocessed wafer 90 may be removed for processing within the reaction chamber 12. By employing mechanically simple transfer arm members 86 and 88 which cooperate in this manner, the size of the transfer chamber 26 can be kept relatively small.

The transfer apparatus 14 also includes arm member actuator means identified generally in FIG. 3 as 96 for pivoting the first and second transfer arm members 86 and 88 to the first, second and intermediate positions as previously described. As best seen in FIGS. 2 and 3, in the presently preferred embodiment, the arm member actuator means 96 comprises a drive motor 98 (in the present embodiment a reversible electric motor) having an output shaft 100 which is coupled to the input shaft 102 of a geneva drive mechanism 104. Both the motor 98 and the geneva drive 104 are of the type well-known in the art and generally commercially available from a variety of manufacturers, such as the Barber-Colman Company of Rockford, Ill. in the case of the motor 98 and the PIC Company in the case of the geneva drive 104. Therefore, specific details of the structure and operation of the motor 98 and the geneva drive 104 will not be presented herein. Suffice it to say that the motor 98 is a standard reversible DC gear type motor and the geneva drive is of the type which provides 90 degrees of rotation of the output shaft 106 for every full revolution of the input shaft 102 and that the motor 98 and the geneva drive mechanism 104 cooperate for the 180 degree pivotal movement of the transfer arm members 86 and 88. It should be appreciated that the arm member actuator means 96 could alternatively comprise a stepper motor (not shown) or any other suitable device to provide the desired movement of the arm members 84 and 86.

The geneva drive output shaft 106 is coupled to an extension shaft (hereinafter called the geneva drive output shaft 106, for simplicity) which extends upwardly through a suitable opening in the transfer chamber bottom wall 36 as shown. Suitably rotary seals are provided where the shaft 106 extends through the transfer chamber bottom wall 36 in order to maintain the airtight condition of the transfer chamber. The first end of the first transfer arm member 86 is secured to and rotates with the upper end of the shaft 106. The first arm member 86 may be secured to the shaft 106 by any suitable means, for example by one or more inwardly extending threaded pins 108 (only one of which is shown). A first sprocket member 110 is also secured to the chamber so as to not rotate with the first transfer arm member 84.

As best seen in FIG. 3, the second or distal end of the first arm member 86 includes an double offset portion 112 which is employed for supporting the second arm member 88. The portion 112 includes an opening (not shown) through which extends a generally vertically oriented supporting shaft 114 journaled for rotation by suitable bearings (not shown). The first end of the second arm member 88 is secured to the upper end of the supporting shaft 114 by any suitable means, such as pins (not shown) so that the second arm member 88 pivots upon the rotation of the supporting shaft 114. A second sprocket member 116 is also secured to the lower end of the supporting shaft 114 as shown. A drive belt, in the present embodiment an endless stainless steel drive belt 118 having a plurality of notches or openings 120 extending therethrough, connects the first sprocket member 110 to the second sprocket member 116 as best shown in FIGS. 3 and 4. The teeth on the first and second sprocket members 110 and 116 engage the openings 120 of the drive belt 118 so that rotation of the first arm member 84 results in a corresponding rotation of the second sprocket member 116. The angular displacement of the upper, second transfer arm member 88 with respect to the lower, first transfer arm member 86 is determined by the ratio of the diameters of the two sprocket members 110 and 116. As shown in FIGS. 3 and 4, the first arm member 86 further includes a telescoping portion 122 and a biasing means, such as a compressed coil spring 124, to maintain a constant tension upon the drive belt 118.

A flat, generally circular cam means, such as a cam member 126 is secured to and rotates with the shaft 106. As explained hereinafter, three position indicating openings 128 extend through the cam member 126. An optically operated switch means, such as an optical switch 130, is positioned proximate to the cam member 126 as shown in FIGS. 2 and 3. The optical switch 130 is of a type well-known in the art and commercially available from the Dyneer Corp. of Chatsworth, Calif. Details of the structure of the optical switch 130 are well known and will not be presented herein. Operationally, the optical switch 130 provides an electrical output signal when a light beam positioned on one side of the cam member 126 is sensed on the other side of the cam member 126, indicating that one of the three cam members openings 128 is in registry with the optical switch 130. By placing the optical switch 130 and the cam member openings 128 in the manner as shown an electrical output signal is generated by the optical switch 130 when the first and second transfer arm members 86 and 88 are in the first, second or intermediate positions as described above and as indicated in FIG. 1. The generated electrical signals are used to control and coordinate the operation of the transfer apparatus as will be described hereinafter. The optical switch 130 and the cam member 126 cooperate to provide a positive indication of the position of the transfer arm members 84 and 86 and thus the wafer during the transfer process.

The cam member 126 is also adapted to engage a cam follower means 132 which is connected to a pressure actuated switch means, such as a microswitch 134 as shown in FIG. 3. As long as the cam follower 132 engages the smaller diameter portion of the cam member 126, the microswitch 134 is not actuated. However, if the shaft 106 were to rotate so that the cam follower 132 were to engage the larger diameter portion of the cam member 126, the microswitch 134 would be actuated to turn off the motor 98 to prevent any further rotation of the shaft 106. The cam follower 132 and microswitch 134 thus serve as a safety device to prevent the geneva drive output shaft 106 and thus the two arm members 86 and 88 from rotating further than the 180 degrees (90 degrees on either side of the third or intermediate position) required for the transfer of the semiconductor wafers.

Figure 6:
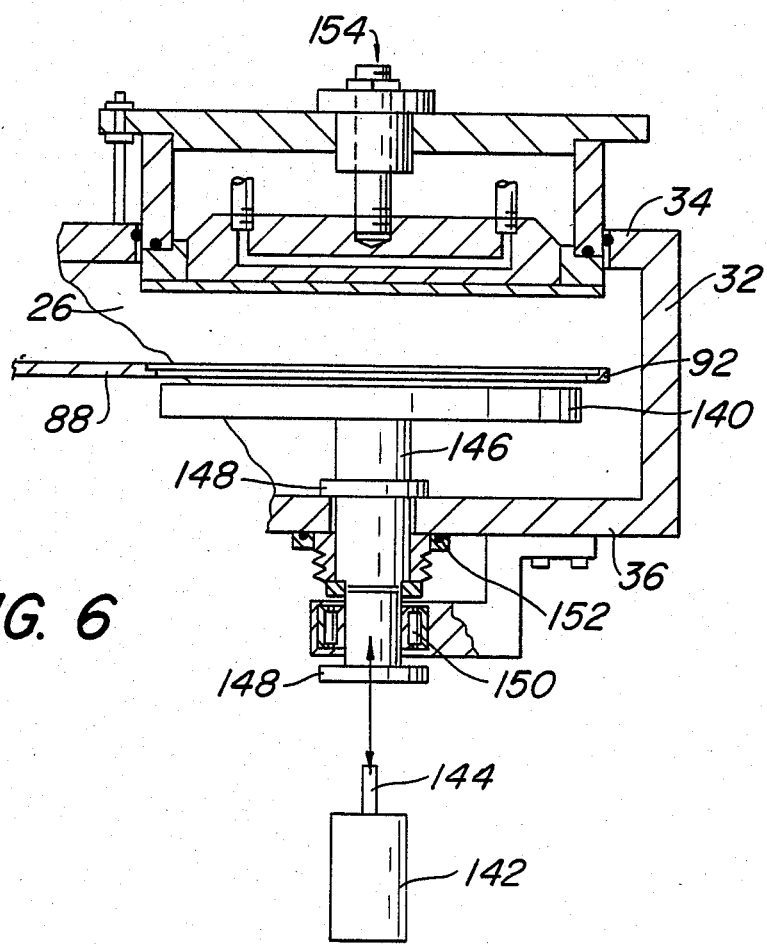
FIG. 6 is a sectional view of the apparatus taken along line 6—6 of FIG. 1.

FIG. 6 illustrates the essential details of means for the pre-treatment of a semiconductor wafer within the transfer chamber 26. In the present embodiment, the pre-treatment consists of the use of a glow discharge process for the purpose of preetching or desmearing of the wafer. However, it should be appreciated that any other type of pre-treatment process such as photo-resist hardening could alternatively be employed. Additionally, although not shown in the drawings, a post-treatment process could be similarly employed in connection with the removal of the process semiconductor wafers from the reaction chamber utilizing the second transfer apparatus 14a.

In the presently preferred embodiment, the pretreatment means comprises a wafer platen 140 which is positioned directly beneath the distal or second end of the second transfer arm member 88 when the transfer arm members 86 and 88 are in the intermediate position (see FIG. 1). The wafer platen 140 has an outer diameter which is slightly less than the inner diameter of the annular lip 94 of the second transfer arm 88 so that the platen 140 may be moved upwardly to lift the wafer off of the lip 94 and to provide firm support over the entire surface of the wafer. In the presently preferred embodiment, the platen 140 is moved upwardly and downwardly by an air actuated cylinder 142 having a piston (not shown) and a piston rod 144 connected to a generally cylindrical shaft 146 which supports the platen 140. Suitable upper and lower limit stops 148, bearings 150 and seals 152 facilitate the upward and downward movement of the shaft 146 and maintain the pressure within the transfer chamber 26. The temperature of the platen 140 is controlled utilizing suitable means, such as electrical wires or fluid conduits (not shown), to maintain the semiconductor wafer at a predetermined temperature.

Positioned directly above the platen 140 is an RF electrode 154 which is employed in conjunction with the glow discharge process. Such devices are generally well known in the art and will not be described in detail herein.

A control means 158 (shown in functional block diagram form only in FIG. 2) coordinates and controls the operation of the transfer port actuator means 46, the transfer arm member actuator means 96, the pressure adjusting means and the pre-treatment means. The control means 158 receives electrical signals from the optical switch 130 and other sensor means, such as pressure and temperature sensors, (not shown) for controlling and coordinating the wafer transfer operation. In the presently preferred embodiment, the control means 158 is a preprogrammed microprocessor equipped control system. However, it should be appreciated that any other conventional type of control system alternately could be employed.

Referring to FIG. 1, operation of the transfer apparatus 14 will now be described. For purposes of illustrating the operation of the transfer apparatus 14, the initial position of the transfer arm members 86 and 88 will assumed to be the intermediate position with both of the transfer ports 38 and 40 being closed.

To begin the transfer operation, the control means 158 activates the pressure adjusting means to adjust the pressure within the transfer chamber 26 to correspond to the pressure of the wafer storage area 42 (substantially atmospheric in the present embodiment). Once the pressure within the transfer chamber substantially corresponds to the pressure of the wafer storage area 42, the control means 158 activates the port actuator means 46 to open the first transfer port 38. The motor 98 is then energized to pivot the two transfer arm members 86 and 88 to the first position as shown in phantom in FIG. 1. When the first and second transfer arm members 86 and 88 are in the first position, the control means receives an electrical signal from the optical switch 130 and deenergizes and reverses the motor 98 to prevent further movement of the transfer arm members 86 and 88. The wafer storage device 43 and the conveyor belts 44 are then activated to transfer a semiconductor wafer and deposit the same upon the distal end of the second transfer arm member 88. The conveyor belts 44 are then pivoted or otherwise moved out of the way and the motor 98 is energized to move the first and second transfer arm members in the opposite direction to the intermediate position within transfer chamber 26 as shown in phantom in FIG. 1. When the transfer arm members 86 and 88 reach the intermediate position, the optical switch 130 generates an electrical signal which deenergizes the motor 98 and causes the port actuator means 46 to close and seal the first transfer port 38. The platen 140 is moved upwardly as previously described to engage and support the wafer and the preprocessing treatment is conducted. Once the preprocessing treatment has been completed, the wafer supporting platen 140 is lowered. The pressure adjusting means may be activated either before, during or after the preprocessing treatment to adjust the pressure within the transfer chamber 26 to substantially correspond to the pressure (usually a vacuum) within the reaction chamber 12. Once the pressure within the two chambers 12 and 26 substantially correspond, the port actuator means 46 is activated to open the second transfer port 40 as shown in FIG. 2. The motor 98 is again energized to cause the first and second transfer arm members 86 and 88 to pivot 90 degrees to the second position as shown in solid lines in FIG. 1. Once the first and second transfer arms 86 and 88 reach the second position, a signal generated by the optical switch 130 deenergizes and reverses the motor. The wafer lifting device 25 then moves upwardly to lift the wafer 90 above the top of the annular ring member 92 on the second transfer arm 88 as shown in phantom in FIG. 2. Thereafter, the motor 98 is again energized to pivot the first and second transfer arm members 86 and 88 back to the intermediate position (the slot 93 permitting the annular ring 92 to pass through the raised lifting device 25) and the second port 40 is actuated by the port actuator means 46 to the closed position. The wafer lifting device 25 then lowers the wafer 90 onto the supporting platen 24 and the plasma gas reaction process is conducted.

From the foregoing description it can be seen that the present invention comprises an apparatus for conveying a semiconductor wafer between two locations, each of which may be at a different pressure, without disturbing the pressure at either location. The present invention also provides for the possibility of pre-treatment or post-treatment of the semiconductor wafer during the transfer operation. It will be recognized by those skilled in the art that changes could be made to the above-described embodiment of the invention without departing from the broad inventive concepts thereof. It is understood, therefore, that this invention is not limited to the particular embodiment disclosed, but it is intended to cover any modifications which are within the scope and spirit of the invention as defined by the appended claims.

I claim:

1. A transfer apparatus for conveying a semiconductor wafer between a first location at a first pressure and a second location at a second pressure without substantially affecting the pressure at either location comprising:

a substantially airtight transfer chamber disposed between the first and second locations, the transfer chamber including a first closeable port for providing communication between the first location and the transfer chamber, a second closeable port for providing communication between the second location and the transfer chamber and port actuator means for opening and closing the first and second ports, the transfer chamber further including means for the treatment of the semiconductor wafer;

transfer means for transferring the wafer between locations including first and second elongated arm members each having first and second ends, the first end of the first arm member being pivotally supported with the transfer chamber and the first end of the second arm member being pivotally supported by the first arm member proximate to the second end of the first arm member, the second end of the second arm member being adapted to receive and support a semiconductor wafer, the first and second arm members being of sufficient length and being cooperative to pivot to at least three positions, the three positions including a first position in which at least a portion of the second end of the second arm member extends through the first port, a second position in which at least a portion of the second end of the second arm member extends through the second port and an intermediate position in which both arm members are located within the transfer chamber, whereby a semiconductor wafer may be placed upon the second end of the second arm member when the arm members are in one of the first or second positions, may be treated by the treatment means when the arm members are in the intermediate position and may be removed when the arm members are in the other of the first and second positions;

arm member actuator means for pivoting the first and second arm members to the first, second and intermediate positions;

pressure adjusting means for adjusting the pressure within the transfer chamber to either the first or the second pressure; and control means for controlling the port actuator means, the arm member actuator means and the pressure adjusting means, whereby the pressure within the transfer chamber is adjusted only when both ports are closed with the arm members in the intermediate position, whereby the first port is opened to permit the arm members to pivot to the first position only when the pressure within the transfer chamber has been adjusted to the first pressure, and, whereby the second port is opened to permit the arm members to pivot to the second position only when the pressure within the transfer chamber has been adjusted to the second pressure.

2. The apparatus as recited in claim 1 wherein the treatment means includes support means for engaging and supporting the semiconductor wafer within the transfer chamber.

3. The apparatus as recited in claim 2 wherein the support means comprises a temperature controlled wafer platen positioned beneath the semiconductor wafer when the arm members are in the third position and means for moving the platen to lift and support the semiconductor wafer.

4. The apparatus as recited in claim 2 wherein the treatment means within the transfer chamber includes means for subjecting the semiconductor wafer to a preetching treatment.

5. The apparatus as recited in claim 2 wherein the treatment means within the transfer chamber includes means for subjecting the semiconductor wafer to a post etching treatment.

6. A transfer apparatus for conveying a semiconductor wafer between a first location at a first pressure and a second location at a second pressure without substantially affecting the pressure at either location comprising:
a substantially airtight transfer chamber disposed between the first and second locations, the transfer chamber including a first closeable port for providing communication between the first location and the transfer chamber, a second closeable port for providing communication between the second location and the transfer chamber and port actuator means for opening and closing the first and second ports;
transfer means for transferring the wafer between locations including first and second elongated arm members each having first and second ends, the first end of the first arm member being pivotally supported within the transfer chamber and the first end of the second arm member being pivotally supported by the first arm member proximate to the second end of the first arm member, the second end of the second arm member being adapted to receive and support a semiconductor wafer, the first and second arm members being of sufficient length and being cooperative to pivot to at least three positions, the three positions including
a first position in which at least a portion of the second end of the second arm member extends through the first port,
a second position in which at least a portion of the second end of the second arm member extends through the second port and
an intermediate position in which both arm members are located within the transfer chamber,
whereby a semiconductor wafer may be placed upon the second end of the second arm member when the arm members are in one of the first or second positions and may be removed when the arm members are in the other of the first and second positions;
arm member actuator means for pivoting the first and second arm members to the first, second and intermediate positions;

pressure adjustng means for adjusting the pressure within the transfer chamber to either the first or the second pressure; and
control means for controlling the port actuator means, the arm member actuator means and the pressure adjusting means,
whereby the pressure within the transfer chamber is adjusted only when both ports are closed with the arm members in the intermediate position,
whereby the first port is opened to permit the arm members to pivot to the first position only when the pressure within the transfer chamber has been adjusted to the first pressure, and,
whereby the second port is opened to permit the arm members to pivot to the second position only when the pressure within the transfer chamber has been adjusted to the second pressure, the transfer chamber further includes side walls and wherein each port comprises an elongated opening extending through a portion of a sidewall of the transfer chamber, a door member larger in dimensions than the opening and being pivotally supported proximate to the opening for pivoting to a closed position in which the opening is sealed and to an open position in which the opening is not sealed.

7. The apparatus as recited in claim 6 wherein the port actuation means comprises an elongated shaft supported for rotation proximate to the door member, means for rotating the shaft in either direction, bearing means supported by the shaft for engaging the door member and for causing the door member to pivot to the closed position upon the rotation of the shaft in one direction and tension means attached between the shaft and the door for causing the door to pivot to the open position upon the rotation of the shaft in the other direction.

8. The apparatus as recited in claim 7 wherein the bearing means maintains the door in the closed position for sealing the port.

9. The apparatus as recited in claim 7 wherein the tension means comprises a coil spring.

10. The apparatus as recited in claim 7 wherein the bearing means comprises a lug member extending radially outwardly from the shaft, an axle member supported upon the lug member, the axle member being generally parallel to the shaft and at least one generally cylindrical bearing member rotatably supported by the axle member for engaging the door member.

11. The apparatus as recited in claim 7 wherein the actuator means further comprises an air actuated piston having a rod extending outwardly therefrom, at least a portion of the piston rod including teeth forming a rack, the shaft including a pinion having teeth which engage the teeth of the piston rod rack, whereby translation of the air piston results in rotation of the shaft.

12. A transfer apparatus for conveying a semiconductor wafer between a first location at a first pressure and a second location at a second pressure without substantially affecting the pressure at either location comprising:
a substantially airtight transfer chamber disposed between the first and second locations, the transfer chamber including a first closeable port for providing communication between the first location and the transfer chamber, a second closeable port for providing communication between the second location and the transfer chamber and port actuator means for opening and closing the first and second ports;

transfer means for transferring the wafer between locations including first and second elongated arm members each having first and second ends, the first end of the first arm member being pivotally supported within the transfer chamber and the first end of the second arm member being pivotally supported by the first arm member proximate to the second end of the first arm member, the second end of the second arm member being adapted to receive and support a semiconductor wafer, the first and second arm members being of sufficient length and being cooperative to pivot to at least three positions, the three positions including a first position in which at least a portion of the second end of the second arm member extends through the first port, a second position in which at least a portion of the second end of the second arm member extends through the second port and an intermediate position in which both arm members are located within the transfer chamber, whereby a semiconductor wafer may be placed upon the second end of the second arm member when the arm members are in one of the first or second positions and may be removed when the arm members are in the other of the first and second positions;

arm member actuator means for pivoting the first and second arm members to the first, second and intermediate positions, the arm member actuator means comprising a reversible motor having an output shaft, the first end of the first arm member being secured to said output shaft, a first nonrotatable sprocket member, a second sprocket member secured to the first end of the second arm member, a drive belt interconnecting the first and second sprocket members whereby rotation of said output shaft results in the pivoting of the first and second arm members; and cam means secured to the motor output shaft for rotation therewith, the cam means including at least one aperture extending therethrough and optically operated switch means proximate the cam means for providing a signal when the cam means assumes a predetermined position;

pressure adjusting means for adjusting the pressure within the transfer chamber to either the first or the second pressure; and control means for controlling the port actuator means, the arm member actuator means and the pressure adjusting means, whereby the pressure within the transfer chamber is adjusted only when both ports are closed with the arm members in the intermediate position, whereby the first port is opened to permit the arm members to pivot to the first position only when the pressure within the transfer chamber has been adjusted to the first pressure, and, whereby the second port is opened to permit the arm members to pivot to the second position only when the pressure within the transfer chamber has been adjusted to the second pressure.

13. The apparatus as recited in claim 12 further including a geneva drive having an input shaft and an output shaft, the geneva drive being interposed between the output shaft of the motor and the first end of the first arm member.

14. The apparatus as recited in claim 12 further including cam means secured to the motor output shaft for rotation therewith, cam follower means for engaging the cam member, and switch means for actuation by the cam follower means upon rotation of the motor output shaft in excess of 180 degrees.

15. The apparatus as recited in claim 12 wherein the cam means includes three apertures, one aperture for each of the three arm member positions, whereby the optically operated switch means generates a signal when the arm members are in either the first, second or intermediate positions.

* * * * *